United States Patent [19]
Akiguchi et al.

[11] Patent Number: 5,427,642
[45] Date of Patent: Jun. 27, 1995

[54] METHOD FOR MOUNTING ELECTRONIC PARTS ON A PRINTED CIRCUIT BOARD BY USE OF AN ADHESIVE COMPOSITION

[75] Inventors: Takashi Akiguchi, Osaka; Yukio Maeda, Hirakata, both of Japan

[73] Assignee: Matsushita Electric Industrial Co., Ltd., Osaka, Japan

[21] Appl. No.: 772,642

[22] Filed: Oct. 8, 1991

Related U.S. Application Data

[63] Continuation of Ser. No. 463,721, Jan. 11, 1990, abandoned.

[30] Foreign Application Priority Data

| Jan. 13, 1989 | [JP] | Japan | 1-7219 |
| Jan. 13, 1989 | [JP] | Japan | 1-7221 |
| Jan. 13, 1989 | [JP] | Japan | 1-7222 |

[51] Int. Cl.⁶ ............................................. B32B 31/00
[52] U.S. Cl. .................... 156/273.3; 156/273.9; 156/275.5; 156/275.7; 156/295; 156/299; 156/331.1; 156/331.8
[58] Field of Search ............ 106/482; 156/272.2, 156/272.6, 272.8, 273.3, 275.5, 275.7, 307.3, 330, 331.4, 331.7, 335, 280, 297, 299, 295, 331.1, 331.8; 29/832, 840

[56] References Cited

U.S. PATENT DOCUMENTS

| 3,746,682 | 7/1973 | Watts | 260/32.6 N |
| 3,928,270 | 12/1975 | South | 260/23.7 M |
| 4,135,033 | 1/1979 | Lawton | 156/327 |
| 4,208,005 | 6/1980 | Nate et al. | 29/840 |
| 4,370,404 | 1/1983 | Tachikawa | 430/302 |
| 4,382,108 | 5/1983 | Carroll et al. | 156/331.7 |
| 4,444,932 | 4/1984 | Francis | 524/232 |
| 4,849,048 | 7/1989 | Inagaki et al. | 29/855 |
| 4,857,111 | 8/1989 | Haubennestel | 106/482 |

FOREIGN PATENT DOCUMENTS

| 0154819 | 9/1985 | European Pat. Off. |
| 58-180090 | 10/1983 | Japan |
| 56180090 | 10/1983 | Japan |
| 2014791 | 8/1979 | United Kingdom |
| 8501634 | 4/1985 | WIPO |

*Primary Examiner*—Chester T. Barry
*Attorney, Agent, or Firm*—Panitch Schwarze Jacobs & Nadel

[57] ABSTRACT

An adhesive composition for use in the mounting of electronic parts on a printed circuit board is disclosed. The composition comprises a photosetting and thermosetting resin ingredient and a long-chain saturated fatty acid amide. Also disclosed is a method for mounting electronic parts on a printed circuit board by the use of such an adhesive composition.

3 Claims, 8 Drawing Sheets

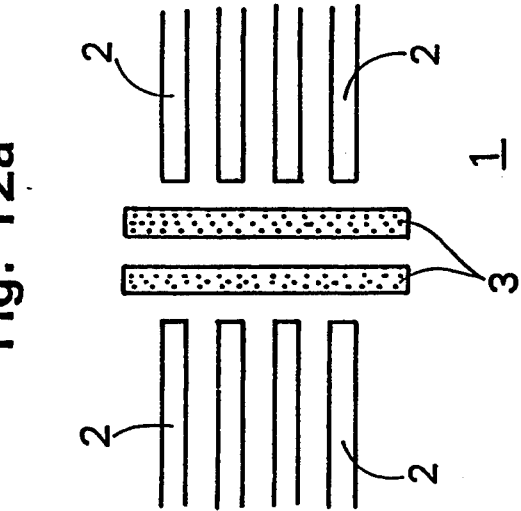
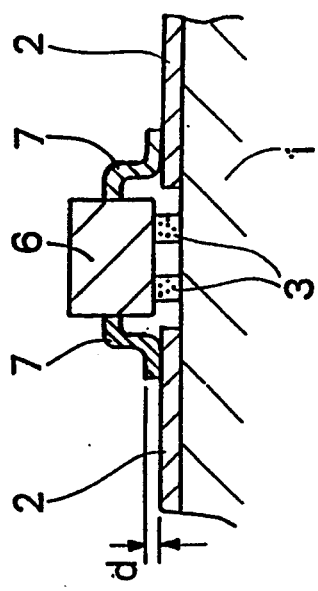
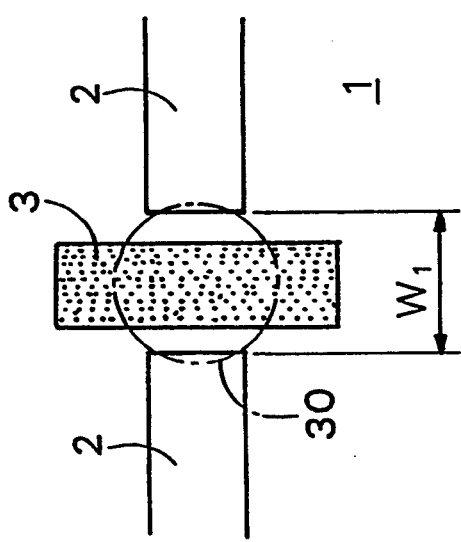
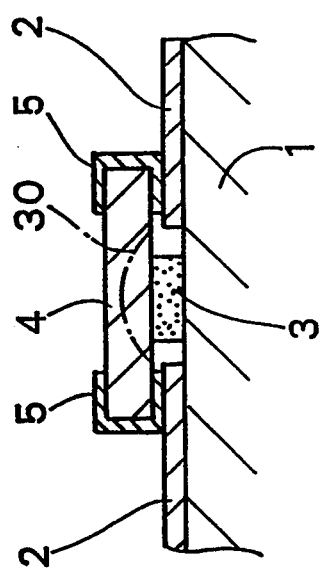

METHOD FOR MOUNTING ELECTRONIC PARTS ON A PRINTED CIRCUIT BOARD BY USE OF AN ADHESIVE COMPOSITION

This application is a continuation of application Ser. No. 07/463,721, filed Jan. 11, 1990, now abandoned.

BACKGROUND OF THE INVENTION

1. Field of the invention:

This invention relates to an adhesive composition for use in the mounting of electronic parts on a printed circuit board, and it also relates to a method for mounting electronic parts on a printed circuit board by the use of the adhesive composition.

2. Description of the prior art

In recent years, when electronic parts such as resistor chips and condenser chips are to be soldered on a printed circuit board, these electronic parts are first fixed on the printed circuit board by the use of a photosetting adhesive composition (see, for example, Japanese Laid-Open Patent Publication No. 58-180090). In such a method, the photosetting adhesive composition is applied to the positions intended for the electronic parts on the printed circuit board, and the photosetting adhesive composition is then made more viscous by the application of light, after which the electronic parts are pressed onto the applied adhesive composition, resulting in a fixing of the electronic parts. When the photosetting adhesive composition is applied, the viscosity of the adhesive composition remains low, so that the operation of application can be readily conducted with the use of a device for application such as a dispenser or the like. When the electronic parts are to be fixed, the flowability of the adhesive composition is made to decrease and the adhesion of the composition is made to increase by the increase in the viscosity of the photosetting adhesive composition, so that the electronic parts will not move out of position.

However, this method has disadvantages in that it is difficult to control the reaction at the time of increasing the viscosity of the adhesive composition by the application of light. That is, when the reaction proceeds too far, the adhesion of the composition decreases or disappears. On the other hand, when the reaction does not proceed far enough, the viscosity of the composition does not increase, so that the electronic parts may readily move out of position.

In order to eliminate these disadvantages, the adhesive composition may be not only photosetting but also thermosetting. The degree of photosetting of this adhesive composition is such that the increase in the viscosity of the composition caused by the application of light is sufficient to fix electronic parts to the desired positions and the curing reaction of the composition will not proceed further. The adhesive composition which has been treated with light to increase its viscosity can be completely cured by the application of heat. This makes it possible to increase the heat resistance of the composition and to prevent the sticking of dust to the composition. In some cases, even if the degree of photosetting of the adhesive composition is controlled as described above, the curing reaction proceeds too far when light is being applied, so that the adhesion of the composition often decrease or disappears.

When a conventional adhesive composition for use in the mounting of electronic parts is used, as shown in FIG. 14, and when UV light is used to treat this adhesive composition SO applied to the surface of a printed circuit board 1, the UV light reaches into the inner portion of the adhesive composition 30, so that all of the adhesive composition 30 gels. The adhesive composition 30 hardens in the shape of a mound, and when each of the electronic parts 4 and 6 is pressed onto this galled adhesive composition 30, the shape of the gelled adhesive composition 30 does not change. Therefore, the electronic parts 4 and 6 remain above the printed circuit board 1 at some distance from the wiring pattern on the printed circuit board 1. Also, the area of contact between the adhesive composition 30 and the electronic parts 4 and 6 is small, so that the adhesion of the composition 30 is not enough to fix the electronic parts 4 and 6 on the printed circuit board 1.

The inventors of this invention found that when an ultraviolet lamp was used, not only ultraviolet light is emitted, but also heat was generated, and that this heat caused the curing of the adhesive composition. This problem arises because the adhesive composition is sensitive to light and heat. By the control of the amount of light emitted from a lamp, it should be possible to overcome this difficulty. However, the amount of light emitted from a lamp is always varying, and hence, it is not possible to control strictly the amount of light to which the adhesive composition is exposed.

The curing property of the adhesive composition is easily affected by light or heat, and the stability of the composition during storage is poor.

If the adhesive composition can be applied to a printed circuit board by a painting technique, the finished mounting condition of the electronic parts will be extremely satisfactory. However, the viscosity of the adhesive composition would have to be much smaller than that of currently available adhesive compositions. In order to decrease the viscosity of the adhesive composition, it may contain a solvent, which raises the problem of toxicity. If the amount of filler in the adhesive composition is decreased, the relative amount of resin ingredients used is increased, resulting in increased cost.

SUMMARY OF THE INVENTION

The adhesive composition of this invention, which overcomes the above-discussed and numerous other disadvantages and deficiencies of the prior art, comprises a photosetting and thermosetting resin ingredient and a long-chain saturated fatty acid amide.

In a preferred embodiment, the resin ingredient is composed of photosetting resin and a thermosetting resin.

In a preferred embodiment, the saturated fatty acid amide is at least one prepared by the reaction of a saturated fatty acid containing 9 to 21 carbon atoms with a tertiary amine.

In a more preferred embodiment, the saturated fatty acid is stearamide.

The method for mounting electronic parts on a printed circuit board of this invention, which overcomes the above-discussed and numerous other disadvantages and deficiencies of the prior art, comprises the steps of: applying the above-mentioned adhesive composition to the positions on the printed circuit board where the electronic parts are to be mounted; exposing said composition to light so that the surface layer of the composition is cured harder than the inner portion thereof, to have sufficient adhesion for fixing the electronic parts; pressing the electronic parts onto the surface layer of the composition to attach them thereto; and heating the composition to cause the curing thereof.

In a preferred embodiment, the adhesive composition is applied by a painting technique so as to take a linear form with a substantially rectangular configuration in section.

In a preferred embodiment, the above-mentioned method further comprises the step of soldering the electronic parts to the printed circuit board.

In a preferred embodiment, the heating of the composition is conducted by the use of heat generated at the time of soldering of the electronic parts to the printed circuit board.

Thus, the invention described herein makes possible the objectives of (1) providing an adhesive composition for use in the mounting of electronic parts in which although the surface layer is cured with light so as to be harder than the inner portion, the cured surface layer is still adhesive, so that by only placing electronic parts on the cured surface layer, the electronic parts can be fixed in the desired positions on a printed circuit board with high accuracy; (2) providing an adhesive composition for use in the mounting of electronic parts that contains long-chain saturated fatty acid amides to reduce the curing rate, so that an excessive decrease in the adhesion of the surface layer can be prevented at the time of the application of light; (3) providing an adhesive composition for use in the mounting of electronic parts that contains long-chain saturated fatty acid amides, so that the viscosity can be decreased without the addition of solvents; (4) providing an adhesive composition for use in the mounting of electronic parts that has excellent stability during storage; and (5) providing a method for mounting electronic parts in the desired positions on a printed circuit board with high accuracy by the use of an adhesive composition as mentioned above.

BRIEF DESCRIPTION OF THE DRAWINGS

This invention may be better understood and its numerous objects and advantages will become apparent to those skilled in the art by reference to the accompanying drawings as follows:

FIG. 2b is a sectional view showing the printed circuit board of FIG. 2a.

FIG. 11a is a top plan view showing a printed circuit board after the application of an adhesive composition thereto.

FIG. 11b is a sectional view showing the printed circuit board of FIG. 11a after the placement of electronic parts.

FIG. 12a is a top plan view showing a printed circuit board after the application of an adhesive composition thereto.

FIG. 12b is a sectional view showing the printed circuit board of FIG. 12a after the placement of the electronic parts.

DESCRIPTION OF THE PREFERRED EMBODIMENTS

Figure 1:
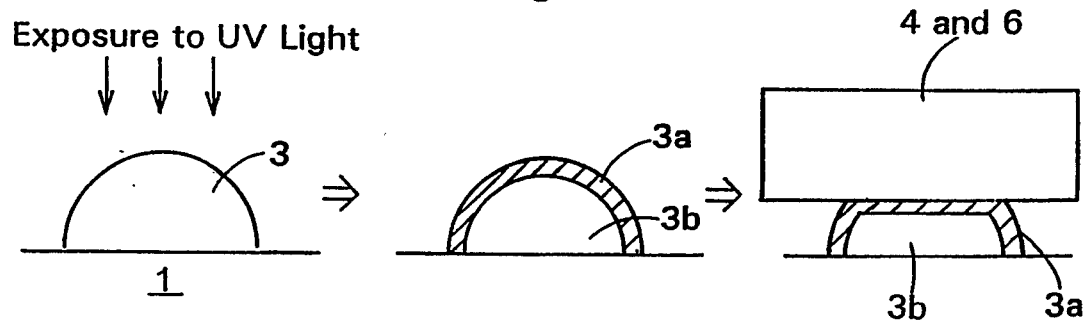
FIG. 1 is a schematic view showing the mounting of electronic parts on a printed circuit board by the use of an adhesive composition of this invention.

The adhesive composition of this invention comprises an intimate mixture of several materials. There are two essential ingredients in the adhesive composition, namely, the photosetting and thermosetting resin ingredient and the long-chain saturated fatty acid amide.

The resin ingredient has sensitivity to heat and light. The resin ingredient contains at least one photosetting functional group and at least one thermosetting functional group. Although the photosetting functional group and the thermosetting functional group can be the same, these functional groups are preferably different. Therefore, it is preferred that a resin containing at least one photosetting functional group (i.e., photosetting resin) and a resin containing at least one thermosetting functional group (i.e., thermosetting resin) are used together as the resin ingredients.

Among the photosetting resins which can be used are monofunctional resins and multifunctional resins which can be cured by the application of UV light. Examples of the monofunctional resins and multifunctional resins are monomers, oligomers, and prepolymers of acrylates and methacrylates (both of which are hereinafter referred as (meth)acrylates).

Examples of the monofunctional (meth)acrylates are methoxyethyl (meth)acrylate, methoxypropyl (meth)acrylate, ethoxyethyl (meth)acrylate, ethoxypropyl (meth)acrylate, butoxyethyl (meth)acrylate, butoxypropyl (meth)acrylate, phenoxyethyl (meth)acrylate, phenoxypropyl (meth)acrylate, nonylphenoxyethyl (meth)acrylate, nonylphenoxypropyl (meth)acrylate, benzoyloxyethyl (meth)acrylate, phenoxydiethylene glycol (meth)acrylate, 2-hydroxy-3-phenoxypropyl (meth)acrylate, dicyclopentenyloxyethyl (meth)acrylate, and (meth)acrylate of a compound formed by addition of ε-caprolacton to tetrahydrofurfuryl alcohol. Examples of the multifunctional (meth)acrylates are polyethylene glycol di(meth)acrylate, polypropylene glycol di(meth- )acrylate, neopentyl glycol di(meth)acrylate, 1,6-hexanediol di(meth)acrylate, trimethylolpropane tri(meth)acrylate, pentaerythritol tri(meth)acrylate, dipentaerythritol hexa(meth)acrylate, 1,4-butanediol di(meth)acrylate, allyl (meth)acrylate, di(meth)acrylate of an ester formed from hydroxypivalic acid and neopentyl glycol, tri(meth)acrylate of a compound formed by addition of propylene oxide to trimethylol propane, and di(meth)acrylate of a compound formed by addition of ethylene oxide to bisphenol A. Monomers, oligomers, or prepolymers of alkyl (meth)acrylates can also be used.

The monofunctional resin is preferably present in an amount of about 10 to 60 percent by weight based on the total weight of the composition. The multifunctionel resin is preferably present in an amount of about 0.01 to 10 percent by weight based on the total weight of the composition.

Examples of the thermosetting resins are those containing a glycidyl group or an isocyanate group. Specific examples of the thermosetting resins are epoxy resins (e.g., bisphenol A type epoxy resins), polyimide resins, phenol resins, and melamine resins. When the epoxy resin is used as the thermosetting resin, curing agents such as emines, acid anhydrides, and polyols are used. When thermosetting resins other than epoxy resin are used, the curing agents can be any of the conventional types which are usually used for these thermosetting resins. Examples of the curing agents are amine-imides, melamine and derivatives thereof such as diallylmelamine, aminonitriles such as diaminomaleonitrile, polyamine salts, tertiary amine salts, allcyclic amines, acid anhydrides, fluoroborate-amine complexes, imidazole and derivatives thereof, hydrazides of organic acids, polyphenols, and polyols. Preferred are aminonitriles such as diaminomaleonitrile, amine-imides, fluoroborate-amine complexes, polyamine salts, melamine and derivatives thereof such as diallylmelamine, imidazole and derivatives thereof, and hydrazides of organic acids.

The thermosetting resin is preferably present in an amount of about 30 to 80 percent by weight and the corresponding curing agent is preferably present in an amount of about 0.1 to 20 percent by weight based on the total weight of the composition.

In order to reduce the curing rate, the adhesive composition of this invention contains long-chain saturated fatty acid amides. Examples of the long-chain saturated fatty acid amides are those obtained by the amidation of saturated fatty acids of the formula $C_nH_{2n+1}COOH$ (where n is preferably equal to about 9 to 21). Specific examples of the saturated fatty acids are captic acid, lauric acid, myristic acid, palmitic acid, stearic acid, arachic acid, and behenic acid. The amines used for the amidation of the saturated fatty acids can be any of the known amines, with tertiary amines being preferred. Preferably, the long-chain saturated fatty acid amides are swollen with aliphatic alcohols, aromatic solvents, or mixtures thereof because of high compatibility with the resin ingredients. Specific examples of the aliphatic alcohols which can be used to swell the acid amides are methyl alcohol, ethyl alcohol, propyl alcohol, isopropyl alcohol, and butyl alcohol. Specific examples of the aromatic solvents which can be used are benzene, toluene, and xylene.

The long-chain saturated fatty acid amide is preferably present in an amount of 1 to 20 percent by weight based on the total weight of the composition.

Also, optional ingredients such as photosensitizing agents, photopolymerization initiators, polymerization inhibitors, organic peroxides, fillers, pigments, thixotropic agents, dispersants, antioxidants, surfactants, and other formulating additives may be included in the composition.

Examples of the photosensitizing agents are those of the molecule-cleaving type and those of the hydrogen-abstracting type. Specific examples of the photosensitizing agents of the molecule-cleaving type are benzoin alkyl ethers, 1-hydroxycyclohexyl phenyl ketone, 2-hydroxy-2-methyl-1-phenylpropane-1-one, diethoxyacetophenone, and trichloroacetophenone. Specific examples of the hydrogen-abstracting photosensitizers are benzophenone plus bis(diethylamino) benzophenone, 2,4-diethylthioxanthone plus p-dimethylaminobenzoate, benzil, 2-alkylanthraquinone, and 2-chloroanthraquinone. Preferred are benzoin alkyl ether, 1-hydroxycyclohexyl phenyl ketone, 2-hydroxy-2-methyl-1-phenylpropane-1-one, diethoxyacetophenone, benzophenone plus bis(diethylamino) benzophenone, 2,4-diethylthioxanthone plus p-dimethylaminobenzoate, and benzil.

Among the fillers which may be used in the composition are calcium carbonate, talc, and the like. The surfactants can be any of the conventional types comprising, for example, polyether-type surfactants, which are preferred. The pigments can be any of the conventional types, with red pigments being preferred.

The adhesive composition of this invention is prepared from the mixture of photosetting and thermosetting resin ingredients with long-chain saturated fatty acid amides and with optional additives such as photosensitizing agents and photopolymerization initiators.

The adhesive composition for use in the mounting of electronic parts obtained in this way contains long-chain saturated fatty acid amides such as stearamide. Therefore, as shown in FIG. 1, when the adhesive composition 3 is exposed to ultraviolet light, the ultraviolet light does not reach the inner portion 3b of the adhesive composition 3, so that only the surface layer 3a of the adhesive composition 3 gels. The surface layer 3a, although it is harder than the inner portion 3b, is still adhesive. For that reason, when each of the electronic parts 4 and 6 is pressed onto the surface of the galled adhesive composition 3, the adhesive composition 3 in the shape of a mound becomes dented end the electronic parts 4 and 6 do not rise from the surface of the wiring pattern. Also, the area of contact between the adhesive composition 3 and the electronic parts 4 and 6 increases, and therefore, the adhesion of the composition 3 is enhanced enough to fix the electronic parts 4 and 6 on the printed circuit board 1.

Next, the following will describe a method for mounting electronic parts on a printed circuit board.

Figure 2A:
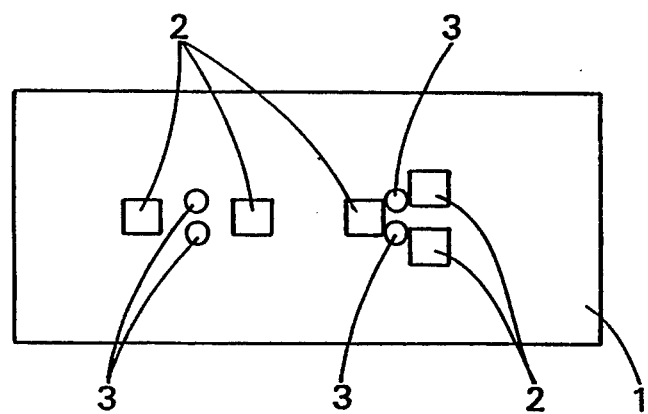
FIG. 2a is a top plan view showing the printed circuit board to which the adhesive composition has been applied.
Figure 2B:
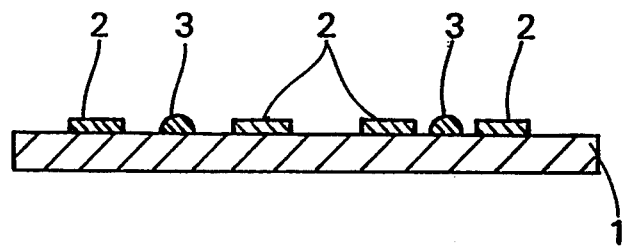

First, as shown in FIGS. 2a and 2b, the adhesive composition 3 of this invention is spotted in the spaces between the islands 2 of the wiring pattern formed on the surface of the printed circuit board 1. The application of the adhesive composition 3 can be conducted by any of the techniques of painting, screen printing, and the like.

Figure 2C:
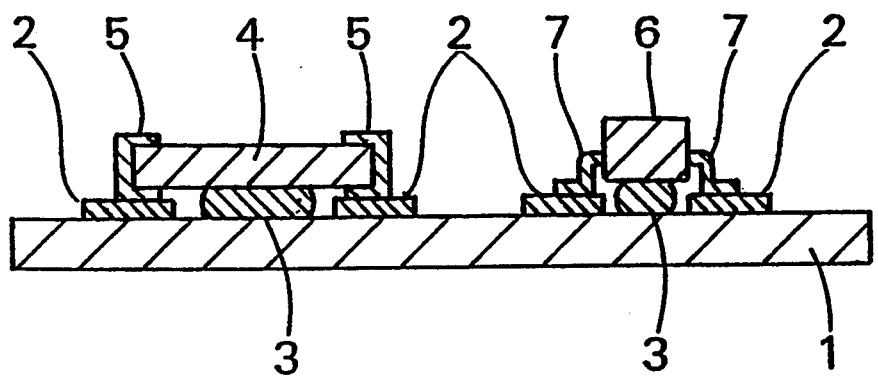
FIG. 2c is a sectional view showing the printed circuit board after the placement of the electronic parts.
Figure 2D:
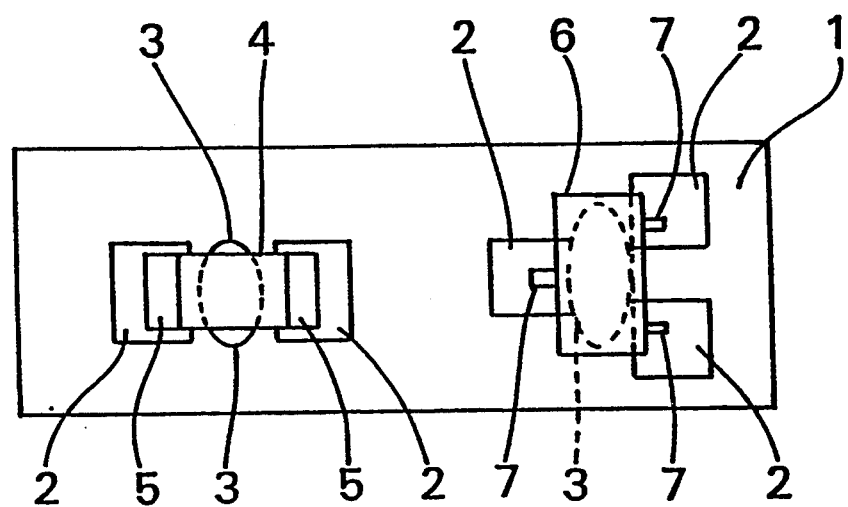
FIG. 2d is a top plan view showing the printed circuit board of FIG. 2c.

Next, UV light is directed toward the surface of printed circuit board 1 to which the adhesive composition 3 has been applied. The UV light causes the surface layer of the adhesive composition 3 to become harder than the inner portion, but the surface layer is still adhesive. The UV light can be emitted from a chemical lamp, sunlamp, mercury lamp, and the like. When high-pressure mercury lamps, metal halide lamps, or other lamps with strong illumination are used, the exposure time can be made shorter. Next, as shown in FIGS. 2c and 2d, electronic parts such as ceramic condenser 4 and mini-molded transistor 6 are placed on the top of the adhesive composition 3, and sufficient pressure is applied to cause attachment via the adhesive composition 3. Here, the ceramic condenser 4 and the mini-molded transistor 6 are placed on the adhesive composition 3 so that the electrodes 5 of the ceramic condenser 4 and the leads 7 of the mini-molded transistor 6 are brought into contact with the islands 2. Other electronic parts such as resistor chips and the like can also be attached in this way.

The viscosity of the adhesive composition 3 is increased by the application of UV light, while retaining adhesion, so that the electronic parts 4 and 6 can be mounted on the printed circuit board 1 without their moving out of position. Also, because the curing of the adhesive composition 3 is slow, control of the extent of its adhesion is easy, and can be done accurately. Next, heat is applied to the adhesive composition 3 to harden it completely, after which the electrodes 5 of the ceramic condenser 4 and the leads 7 of the mini-molded transistor 6 are soldered to the islands 2.

FIGS. 3 and 4a–4d show another method for mounting electronic parts of this invention. The following will describe this method in detail.

Figure 4A:
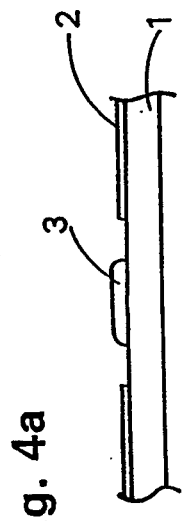
FIGS. 4a-4d are side views showing the process of mounting based on the flow chart shown in FIG. 3.
Figure 4B:
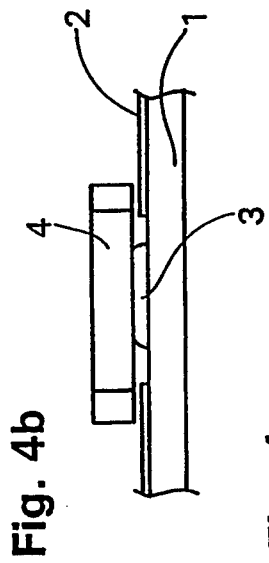
Figure 4C:
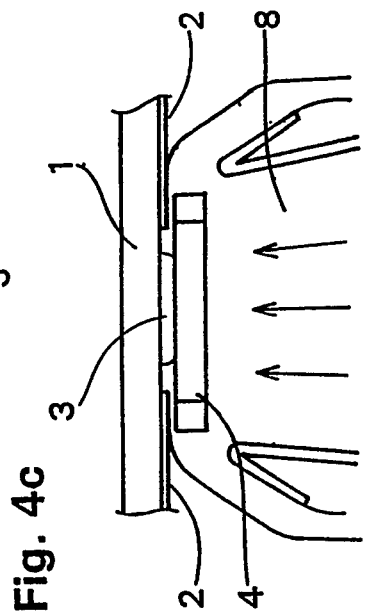
Figure 4D:
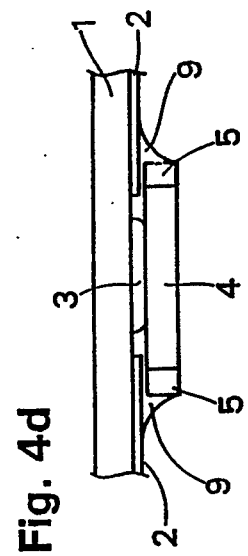
Figure 3:
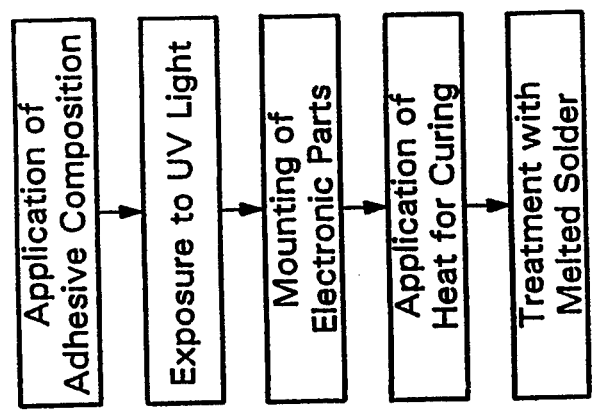
FIG. 3 is a flow chart of another method for mounting electronic parts of this invention.
Figure 5:
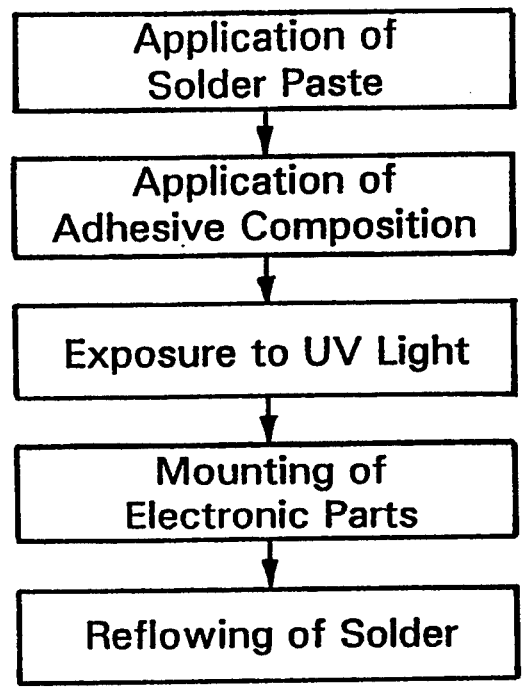
FIG. 5 is a flow chart of still another method for mounting electronic parts of this invention.

First, as shown in FIG. 4a, the adhesive composition 3 is applied to the spaces between the islands 2 of a printed circuit board 1. The adhesive composition 3 is made more viscous with the application of UV light so that the surface layer is harder than the inner portion, while retaining adhesion. Then, as shown in FIG. 4b, one of the electronic parts 4 is placed onto the top of adhesive composition 3. Next, heat is applied to the adhesive composition 3 to harden it completely, after which, as is shown in FIG. 4c, a stream of melted solder 8 is allowed to flow along the surface of the printed circuit board 1 where the electronic parts are placed, so that the electrodes 5 of the electronic parts 4 are soldered to the islands 2 of the printed circuit board I as shown in FIG. 4d.

FIGS. 5 and 6a–6d show still another method for mounting electronic parts of this invention. The following will describe the method in detail.

Figure 6A:
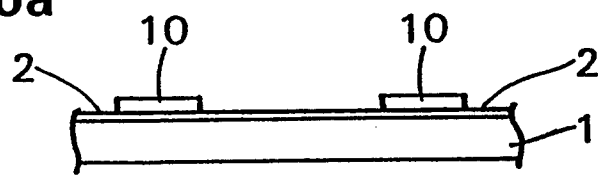
FIGS. 6a-6d are side views showing the process of mounting based on the flow chart shown in FIG. 5.
Figure 6B:
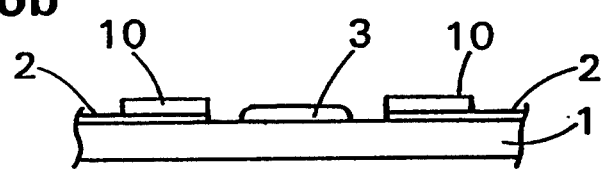
Figure 6C:
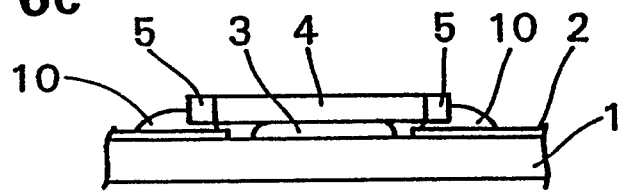
Figure 6D:
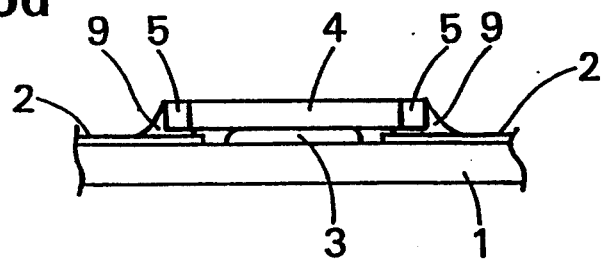

First, as shown in FIG. 6a, solder paste 10 is applied to the islands 2 of the printed circuit board 1. Then, the adhesive composition 3 is applied to the space between the islands 2 as shown in FIG. 6b. The applied adhesive composition 3 is exposed to UV light to increase its viscosity. The surface layer of the adhesive composition 3 becomes harder than the inner portion, while remaining adhesive. Next, as shown in FIG. 6c, one of the electronic parts 4 is pressed onto the surface of the adhesive composition 3 to attach it. Thereafter, the printed circuit board 1 is heated so that the solder paste 10 is melted, whereby the electrodes 5 of the electronic parts 4 are soldered to the islands 2 of the printed circuit board 1 as shown in FIG. 6d. This heating in the step of solder reflowing causes the adhesive composition 3 to harden completely.

The method for the application of the adhesive composition of this invention by a painting technique will hereinafter be explained.

Figure 7A:
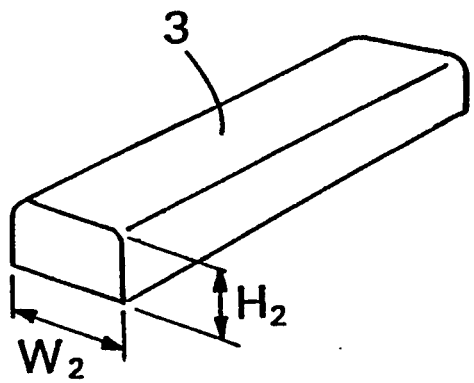
FIG. 7a is a perspective view showing the adhesive composition of this invention when applied in a preferable form.
Figure 7B:
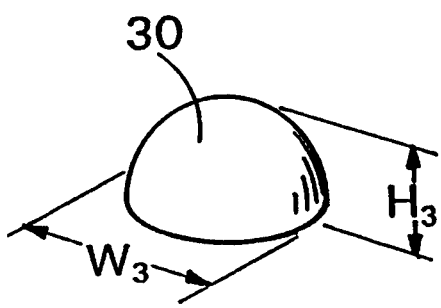
FIG. 7b is a perspective view showing the adhesive composition of this invention when applied by the use of a dispenser.

FIG. 7a shows the shape of adhesive composition 3 applied by the painting technique. The width $W_2$ and height $H_2$ of the applied adhesive composition 3 can be accurately controlled with the use of this technique. If the height $H_2$ of the adhesive composition 3 is not precisely controlled, the adhesion between the electrodes of electronic parts and the islands of the wiring pattern will be unsatisfactory. In a conventional application method using a dispenser, adhesive composition 30 is applied in the shape of a round mound as shown in FIG. 7b. Therefore, it is difficult to bring about adhesion between the adhesive composition 30 and the electronic parts, unless the base area of the adhesive composition 30 (the diameter $W_3$ thereof being slightly smaller than the distance $W_1$ between the two islands 2) is made great and the height $H_3$ is made high.

When a dispenser is used for the application of adhesive composition, the adhesive composition 30 as shown in FIG. 7b comes into contact with the electronic parts only at its peak. On the other hand, when the painting technique mentioned above is used, the adhesive composition 3 as shown in FIG. 7a comes into contact with the electronic parts along its upper surface, so that the adhesion of the composition to the electronic parts is strong.

Figure 8A:
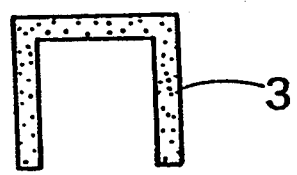
FIGS. 8a-8b are top plan views showing patterns of the adhesive composition when painted.
Figure 8B:
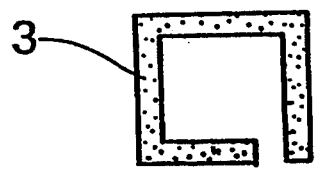

The adhesive composition applied to the printed circuit board can be in the shape of drops, a single line, several lines, or, as shown in FIGS. 8a and 8b, in the shape of lines with changes in direction. When the applied adhesive composition is in the shape of lines with changes in direction, the shapes such as those shown in FIGS. 8a and 8b are preferred in order to prevent air from being trapped inside the area surrounded by the lines.

The invention will be further explained by reference to the following illustrative examples.

EXAMPLE 1

An adhesive composition I for use in the mounting of electronic parts was prepared from the following ingredients:

| Ingredient | Amount (wt %) |
| --- | --- |
| Phenoxyethyl acrylate | 17.9 |
| 1.6-Hexanediol acrylate | 0.75 |
| Benzyldimethylketal | 2.2 |
| Bisphenol A type epoxy resin | 52.2 |
| Dicyanodiamide | 3.7 |
| Stearamide | 7.5 |
| Polyether | 0.75 |
| Talc | 14.9 |
| Hydroquinone | 0.1 |

The slowness of the curing of the adhesive composition I obtained and the stability thereof upon storage were tested. The results are shown by marks in FIGS. 9 and 10.

In the test of the slowness of curing, test samples were placed 10 cm below a UV lamp (80 W/cm) and exposed to UV light from the lamp. After the exposure, the above adhesive composition was measured for strength of adhesion. In the test of stability during storage, test samples were placed in the atmosphere at 30° C. and the viscosity of the adhesive composition after being stored for a certain period was measured. The viscosity was measured using an E-type viscometer under the conditions of 3° cone, 0.5 ppm, and 30° C.

Figure 9:
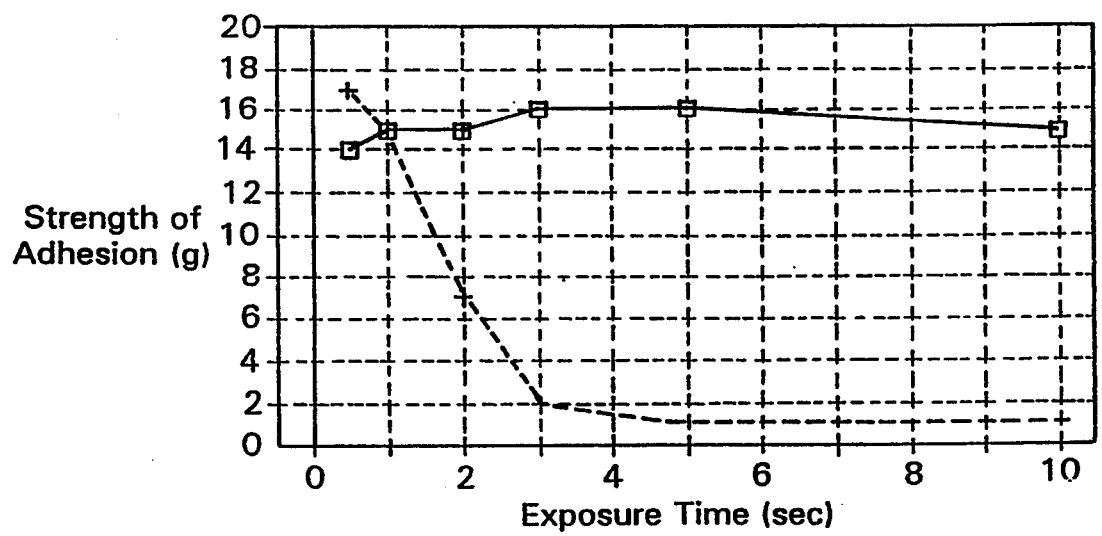
FIG. 9 is a graph showing the relationship between the exposure time to UV light and the strength of adhesion for the adhesive compositions of Example 1 and of Comparative Example 1.
Figure 10:
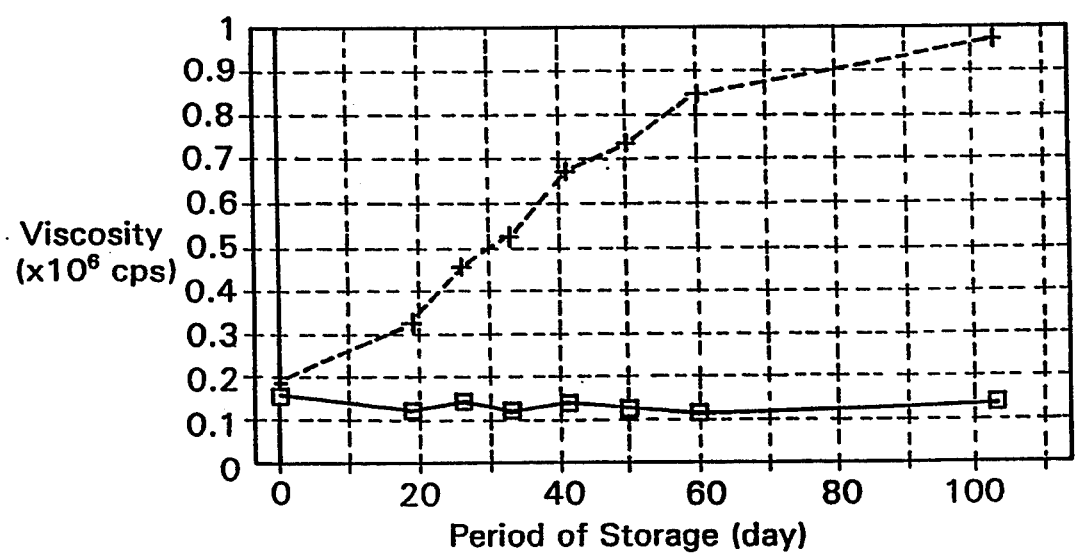
FIG. 10 is a graph showing the relationship between the period of storage and the viscosity for the adhesive compositions of Example 1 and of Comparative Example 1.

As can be seen from FIG. 9, the adhesive composition I of this invention was cured slowly, so that the strength of adhesion thereof did not decrease even when the exposure time to UV light was long. As can be seen from FIG. 10, the adhesive composition I of this invention did not change in viscosity when stored for a long period of days.

Comparative Example 1

An adhesive composition II for use in the mounting of electronic parts was prepared in the same way as in Example 1, except that stearamide was not added thereto. The slowness of the curing of the adhesive composition II and the stability upon storage thereof were tested. The results are shown by marks in FIGS. 9 and 10.

As can be seen from FIG. 9, the sensitivity of the adhesive composition II to UV light is too great, and the strength of adhesion rapidly falls with increases in the exposure time. As can be seen from FIG. 10, the viscosity of the adhesive composition II began immediately to increase when stored at 30° C.

The viscosity of the adhesive composition II was 180,000 cps at 30° C. just after the preparation. The viscosity of the adhesive composition I containing stearamide was 150,000 cps at 30° C. Thus, it was found that the addition of stearamide to the adhesive composition causes a decrease of 30,000 cps in the viscosity of the adhesive composition at 30° C.

EXAMPLE 2

The adhesive composition I obtained in Example 1 was used to mount electronic parts on a printed circuit board as follows.

First, as shown in FIGS. 2a and 2b, the adhesive composition I (referred to as adhesive composition 3 in this example) was dotted by the use of a dispenser in the space between the islands 2 of a wiring pattern formed on the surface of a printed circuit board. Next, the surface of the printed circuit board 1 to which the adhesive composition 3 had been applied was exposed to UV light. The surface layer of the adhesive composition 3 became harder than the inner portion, while remaining adhesive. Then, as shown in FIGS. 2c and 2d, ceramic condenser 4 and mini-molded transistor 6 were placed on the adhesive composition 3, and fixed to the adhesive composition 3 by the application of sufficient pressure from a mounting head. The electronic parts were placed by an automatic placement apparatus. Next, the adhesive composition 3 was heated with use of a far infrared heater, so as to be completely cured, after which the electrodes 5 of the ceramic condenser 4 and the terminals 7 of the mink-molded transistor 6 were soldered to the islands 2.

After a thousand electronic parts were mounted on the printed circuit board, the positions of these electronic parts were checked by measurement. It was found that none of the electronic parts were 0.3 mm or more out of position.

Comparative Example 2

A thousand electronic parts were mounted on a printed circuit board in the same way as in Example 2, except for the use of the adhesive composition II obtained in Comparative Example 1, after which the positions of these electronic parts were checked by measurement. It was found that five of the electronic parts were 0.3 mm or more out of position.

Example 3

With the use of the adhesive composition I obtained in Example 1, ceramic condenser 4 was mounted on a printed circuit board I as shown in FIGS. 3 and 4a–4d.

First, as shown in FIG. 4a, the adhesive composition I (referred to as adhesive composition 3 in this example) was applied to the spaces between the islands 2 on a printed circuit board 1. Next, the adhesive composition 3 was exposed to UV light so as to become more viscous. The surface layer of the adhesive composition 3 became harder than the inner portion, while remaining adhesive. As shown in FIG. 4b, the ceramic condenser 4 was placed on the adhesive composition 3, and then, as shown in FIG. 4c, the surface of the printed circuit board 1 was treated with a stream of melted solder 8. Next, as shown in FIG. 4d, the electrodes 5 of the ceramic condenser 4 were soldered to the islands 2 of the printed circuit board 1 with solder 9.

Example 4

The adhesive composition I obtained in Example 1 was used to mount ceramic condenser 4 on a printed circuit board I by the reflowing method as shown in FIGS. 5 and 6a–6d.

First, as shown in FIG. 6a, solder paste 10 was applied to the islands 2 of the printed circuit board 1 by a screen printing technique. Next, as shown in FIG. 6b, the adhesive composition I (referred to as adhesive composition 3 in this example) was applied to the spaces between the islands 2, and then made more viscous by the application of UV light. The surface layer of the adhesive composition 3 became harder than the inner portion, while remaining adhesive. Thereafter, as shown in FIG. 6c, ceramic condenser 4 was pressed onto the top of the adhesive composition 3 so as to be fixed to it. Then, the printed circuit board 1 was heated by the use of a heated blast of air, and the solder paste 10 was melted. As shown in FIG. 6d, the electrodes 5 of the ceramic condenser 4 were soldered onto the islands 2 of the printed circuit board 1 with solder 9. At this time, the adhesive composition 3 was completely cured by heat generated from the reflowing of solder.

Example 5

The adhesive composition I obtained in Example 1 was used to mount electronic parts on a printed circuit board as shown in FIGS. 11a and 11b.

Figure 13:
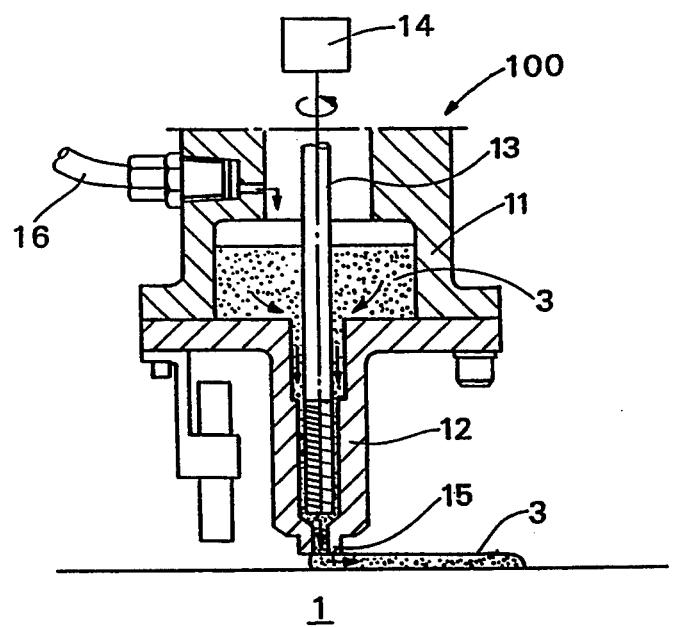
FIG. 13 is a sectional view showing a painting head used in the process of application of an adhesive composition by a painting technique.
Figure 14:
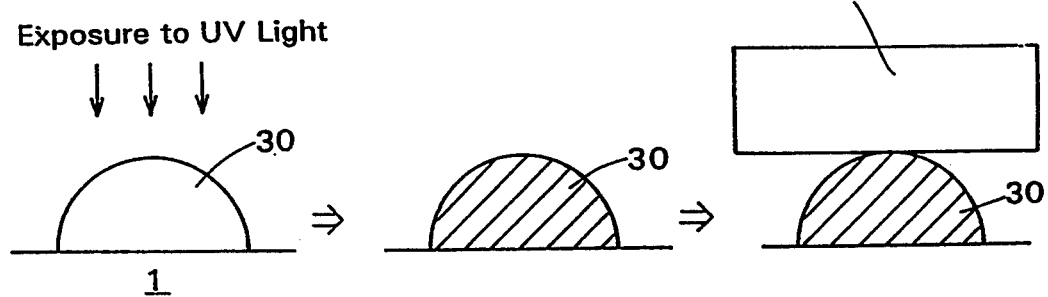
FIG. 14 is a schematic view showing the mounting of electronic parts on a printed circuit board by the use of a conventional adhesive composition.

First, as shown in FIG. 11a, the adhesive composition I (referred to as adhesive composition 3 in this example) was applied to the spaces between the islands 2 (the distance $W_1$ between the spaces being 0.6 mm) of the wiring pattern formed on the printed circuit board 1 by a painting technique, using a painting head 100 as shown in FIG. 13. The width of the applied adhesive composition 3 was 0.3 mm and the height thereof was 0.2 mm. Next, the adhesive composition 3 was made more viscous by the application of UV light to the surface of the printed circuit board to which the adhesive composition 3 had been applied. As shown in FIG. 11b, one of the electronic parts 4 was pressed onto the adhesive composition 3 so as to be fixed to it. By this step of being pushed, the width of the adhesive composition 3 increased somewhat compared to the original width, but the adhesive composition 3 did not come into contact with the islands 2. The electrodes 5 of the electronic parts 4 were attached to the islands 2. In this example, the shape of the adhesive composition 3 after application by the painting technique was as shown in FIG. 7a. It was possible to control not only the width $W_2$ (=0.3 mm) but also the height $H_2$ (=0.2 mm) of the applied adhesive composition 3 with precision.

The painting head 100 used in this example had a housing 11 for containing the adhesive composition 3, a screw shaft 13 provided inside the nozzle 12 of the housing 11, and an air pipe 16 for supplying compressed air inside the housing 11. There was a spiral pump composed of the screw shaft 13 and the lower part of the nozzle 12. When the screw shaft 13 was made to rotate by means of a motor 14, the adhesive composition 3 was directed to an outlet 15. The adhesive composition 3 flowed out of the outlet 15 in the form of a line by the pressure of the compressed air passing through the air pipe 16 and by the movement of the spinal pump mentioned above.

Comparative Example 3

The adhesive composition II obtained in Comparative Example I was put into the painting head 100 that was used in Example 5, but because the viscosity of the adhesive composition II was too high, it did not flow out of the outlet 15.

Example 6

FIGS. 12a and 12b show an example of the mounting of discrete electronic parts such as mini-molded transistor onto a printed circuit board 1 by the use of the adhesive composition I obtained in Example 1. As shown in FIG. 12a, two lines of the adhesive composition I (referred to as adhesive composition 3 in this example) were applied in the spaces between the islands 2 of the wiring pattern formed on a printed circuit board 1 by a painting technique using the painting head 100 described in Example 5. Next, the adhesive composition 3 was made more viscous by the application of UV light to the surface of the printed circuit board 1 to which the adhesive composition had been applied. As shown in FIG. 12b, one of the electronic parts 6 was placed on the adhesive composition 3, and the leads 7 on both right and left sides of the electronic part 6 were attached to the islands 2 on both sides of the electronic part 6. Even when the thickness d of the leads 7 was less than 0.2 mm, the leads 7 could be attached accurately to the islands 2, because it was possible to control the height of the applied adhesive composition 3 with accuracy.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for mounting electronic parts on a printed circuit board, comprising the steps of:

providing an adhesive composition having such a low viscosity that it is applied to a printed circuit board by a painting technique and comprising: (1) a resin ingredient selected from the group consisting of (a) a single compound having at least one photosetting functional group and at least one thermosetting functional group, and (b) a combination of a photosetting resin and a thermosetting resin; (2) stearamide; and (3) an agent selected from the group consisting of an aliphatic alcohol, an aromatic solvent and a mixture thereof, wherein said stearamide is swollen with said agent and is then mixed with said resin ingredient;

applying said composition by said painting technique so as to take a linear form with a substantially rectangular configuration in section, to the positions on said printed circuit board where said electronic parts are to be mounted;

exposing said composition to light so that the viscosity of the surface layer of said composition increases more than that of the inner portion thereof, to have sufficient adhesion for fixing said electronic parts;

pressing said electronic parts onto the surface layer of said composition to attach them thereto;

soldering said electronic parts to the printed circuit board; and heating said composition by the use of heat generated at the time of soldering of said electronics parts to the printed circuit board to cause said composition to harden completely.

2. A method according to claim 1, wherein said aliphatic alcohol is selected from the group consisting of methyl alcohol, ethyl alcohol, propyl alcohol, isopropyl alcohol and butyl alcohol.

3. A method according to claim 1, wherein said aromatic solvent is selected from the group consisting of benzene, toluene and xylene.

* * * * *